(12) United States Patent
Lam

(10) Patent No.: US 9,905,498 B2
(45) Date of Patent: Feb. 27, 2018

(54) ELECTRONIC PACKAGE

(71) Applicant: ATMEL CORPORATION, San Jose, CA (US)

(72) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/149,029

(22) Filed: May 6, 2016

(65) Prior Publication Data
US 2017/0323845 A1 Nov. 9, 2017

(51) Int. Cl.
| | |
|---|---|
| H01L 23/42 | (2006.01) |
| H01L 23/495 | (2006.01) |
| H01L 23/00 | (2006.01) |
| H01L 21/48 | (2006.01) |
| H01L 21/56 | (2006.01) |
| H01L 21/78 | (2006.01) |
| H01L 23/31 | (2006.01) |

(52) U.S. Cl.
CPC .... *H01L 23/49548* (2013.01); *H01L 21/4821* (2013.01); *H01L 21/4825* (2013.01); *H01L 21/4842* (2013.01); *H01L 21/561* (2013.01); *H01L 21/565* (2013.01); *H01L 21/78* (2013.01); *H01L 23/49517* (2013.01); *H01L 23/49575* (2013.01); *H01L 24/45* (2013.01); *H01L 23/3121* (2013.01); *H01L 23/49513* (2013.01); *H01L 2924/17151* (2013.01)

(58) Field of Classification Search
None
See application file for complete search history.

(56) References Cited

U.S. PATENT DOCUMENTS

| | | | | |
|---|---|---|---|---|
| 6,197,615 B1 * | 3/2001 | Song | ................ | H01L 23/49503 257/E23.037 |
| 7,064,419 B1 * | 6/2006 | Bayan | ................... | H01L 21/561 257/666 |
| 8,076,184 B1 * | 12/2011 | Camacho | ................ | H01L 24/29 257/E21.499 |
| 2004/0046238 A1 * | 3/2004 | Hwee | .................... | H01L 21/565 257/678 |
| 2006/0170081 A1 * | 8/2006 | Gerber | ................ | H01L 21/4832 257/666 |

(Continued)

OTHER PUBLICATIONS

Amkor Technology, "RF/Wireless Design Services," Service Solutions, Apr. 2009, www.amkor.com, 2 pages.

*Primary Examiner* — Michael Lebentritt
(74) *Attorney, Agent, or Firm* — Fish & Richardson P.C.

(57) ABSTRACT

The disclosed embodiments of electronic packages include electrical contact pad features present on all sides of the package that facilitate simple and low cost electrical connections to the package made through a mechanical contacting scheme. In an embodiment, an electronic package comprises: a metal leadframe having a first leadframe portion having a first thickness and a second leadframe portion having a second thickness that is less than the first thickness, the second leadframe portion defining electrical contact pads; a silicon die attached to the second leadframe portion and overlying a space formed in the leadframe by the first and second leadframe portions; and wirebonds coupling the silicon die to the electrical contact pads. A method of fabricating the electronic package is also disclosed.

13 Claims, 13 Drawing Sheets

(56) References Cited

U.S. PATENT DOCUMENTS

| | | | |
|---|---|---|---|
| 2006/0192295 A1* | 8/2006 | Lee | H01L 23/16 257/778 |
| 2006/0208363 A1* | 9/2006 | Shiu | H01L 23/49575 257/777 |
| 2006/0240592 A1* | 10/2006 | Chai | H01L 25/50 438/106 |
| 2006/0255438 A1* | 11/2006 | Omori | H01L 21/565 257/670 |
| 2007/0063145 A1* | 3/2007 | Kierse | G01J 5/041 250/370.14 |
| 2007/0200253 A1* | 8/2007 | Gogoi | B81B 7/0048 257/779 |
| 2008/0079127 A1* | 4/2008 | Gerber | H01L 21/4828 257/676 |
| 2009/0218492 A1* | 9/2009 | Kierse | G01J 1/04 250/338.4 |
| 2011/0111562 A1* | 5/2011 | San Antonio | H01L 21/4832 438/113 |
| 2011/0163433 A1* | 7/2011 | Toda | H01L 21/4828 257/676 |
| 2011/0316133 A1* | 12/2011 | Do | H01L 21/561 257/676 |
| 2014/0151697 A1* | 6/2014 | Ausserlechner | H01L 21/50 257/48 |
| 2014/0226346 A1* | 8/2014 | Kobayashi | H05K 1/0274 362/382 |
| 2015/0130037 A1* | 5/2015 | Puschner | H01L 23/49541 257/676 |

\* cited by examiner

ELECTRONIC PACKAGE

TECHNICAL FIELD

The subject matter of this disclosure relates generally to electronic packaging.

BACKGROUND

Electronic packages may include contact pads available on one side of the package. Attempting to make mechanical contact for reliable connection may involve complex and expensive contacting schemes. For example, some packages may involve securing the package in a product first and then introducing mechanical contacts to make electrical connection to the contact pads on the one side of the package. This technique, however, becomes difficult to apply to small electronic packages (e.g., 2 mm×2 mm range or smaller).

SUMMARY

The disclosed embodiments of electronic packages include electrical contact pad features present on multiple sides of the package that facilitate simple and low cost electrical connections to the package made through a mechanical contacting scheme.

In an embodiment, an electronic package comprises: a metal leadframe having a first leadframe portion having a first thickness and a second leadframe portion having a second thickness that is less than the first thickness, the second leadframe portion defining electrical contact pads; a silicon die attached to the second leadframe portion and overlying a space formed in the leadframe by the first and second leadframe portions; and wirebonds coupling the silicon die to the electrical contact pads.

In an embodiment, a method of fabricating an electronic package comprises: defining electrical contact pads in a metal leadframe by forming a first leadframe portion having a first thickness and a second leadframe portion having a second thickness less than the first thickness; attaching a silicon die to the second leadframe portion such that the silicon die overlies a space formed in the leadframe by the first and second leadframe portions. The silicon die attachment onto the second leadframe uses an electrically non-conductive adhesive material.

In an embodiment, an electronic package comprises: first and second leadframe portions of a leadframe defining first and second electrical contact pads, respectively; a space formed between the etched portions; a silicon die attached to the etched portions and overlying the space; and wirebonds coupling the silicon die to the electrical contact pads.

In an embodiment, an electronic package comprises: first and second etched leadframe portions of a leadframe defining first and second electrical contact pads, respectively; mold material positioned between the etched portions; a silicon die attached to the etched portions and overlying the mold material; and wirebonds coupling the silicon die to the electrical contact pads.

BRIEF DESCRIPTION OF THE DRAWINGS

FIGS. 3A-3D illustrate example methods of attaching mechanical metal contacts to opposing sides of an electronic package, according to an embodiment.

DETAILED DESCRIPTION

The disclosed embodiments of electronic packages include electrical contact pad features present on multiple sides of the package that facilitate simple and low cost electrical connections to the package made through a mechanical contacting scheme.

Example TSB Electronic Package

Figure 1A:
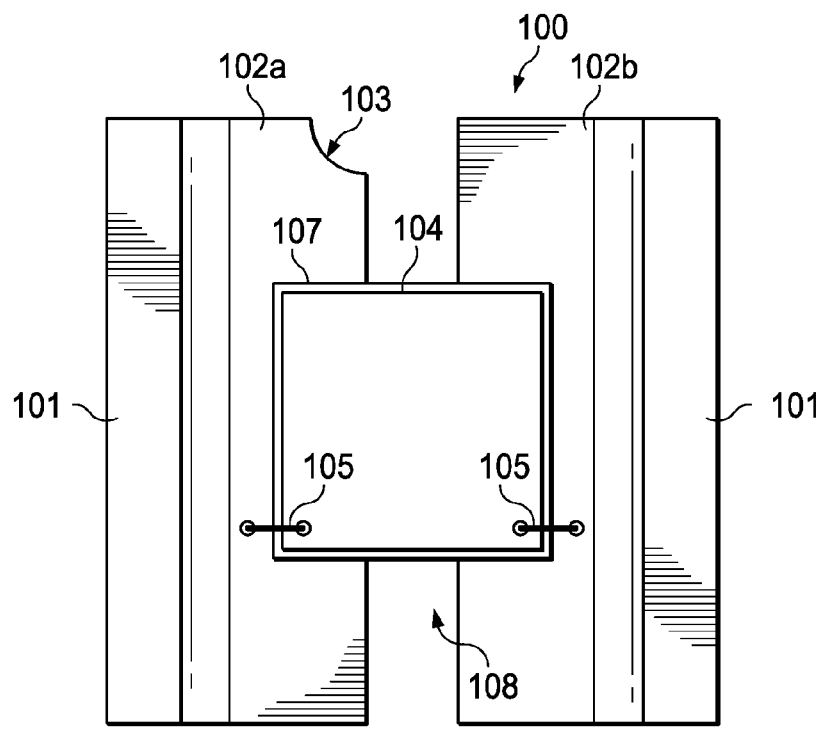
FIGS. 1A-1G are various views of an example electronic package, according to an embodiment.

FIG. 1A is a top view of an example electronic package 100 before molding, according to an embodiment. It is noted that electronic package 100 may be implemented as a top-side-bottom (TSB) electronic package. Package 100 includes leadframe 101 and silicon die 104 coupled to leadframe 101 by non-conductive die attachment material 107. Leadframe 101 is a metal structure inside package 100 that carries signals from silicon die 104 to outside package 100. Leadframe 101 has a first leadframe portion (e.g., a non-etched leadframe portion) having a first thickness and a second leadframe portion (e.g., an etched leadframe portion) having a second thickness that is less than the first thickness. In some implementations, leadframe 101 includes etched portions 102a, 102b (e.g., "half-etched" portions) and non-etched portions with a "full" leadframe thickness (e.g., a thickness in a range of 0.3 mm to 1.5 mm). An optional package orientation indicator 103 can be included in leadframe 101. In an embodiment, leadframe 101 can also be fabricated with etching, metal stamping or coining processes. Leadframe 101 can be plated with metal to facilitate wire bonding. Silicon die 104 is attached to etched portions 102a, 102b by die attachment material 107 (e.g., epoxy material, acrylic material). Wirebonds 105 electrically couple silicon die 104 to etched portions 102a, 102b. In the example embodiment shown, silicon die 104 is overlying across leadframe space 108. In other embodiments, small silicon die 104 may be small enough to fit on one of etched portions 102a, 102b. In this case, either conductive or non-conductive die-attach materials can be used. It is noted that the term "space," as used herein, may refer to a space that is empty or a space that is filled in with a particular material.

Figure 1B:
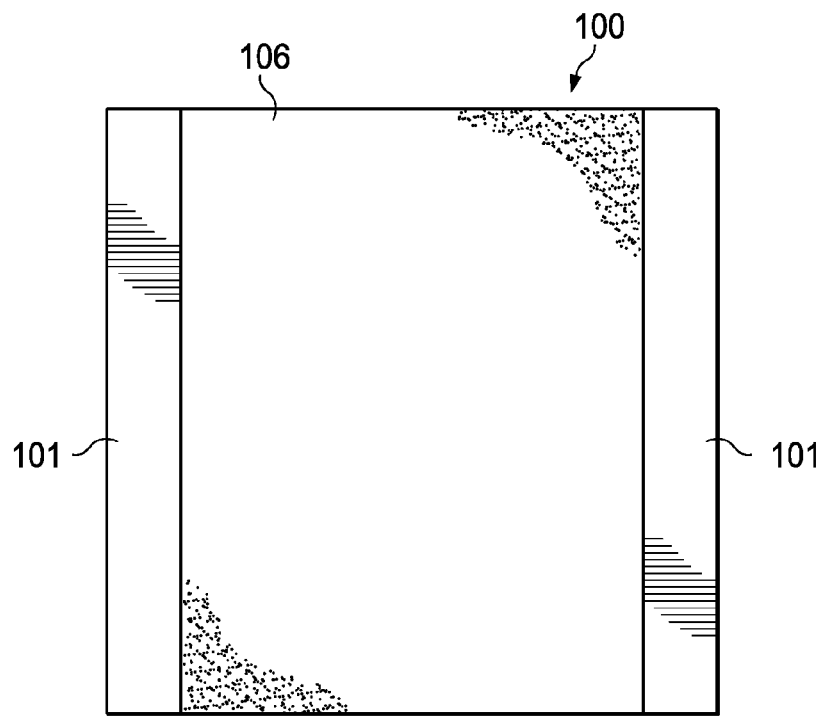
Figure 1C:
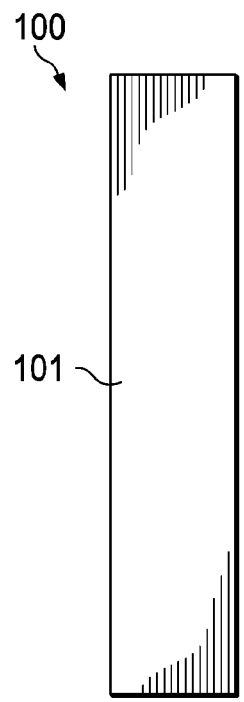
Figure 1D:
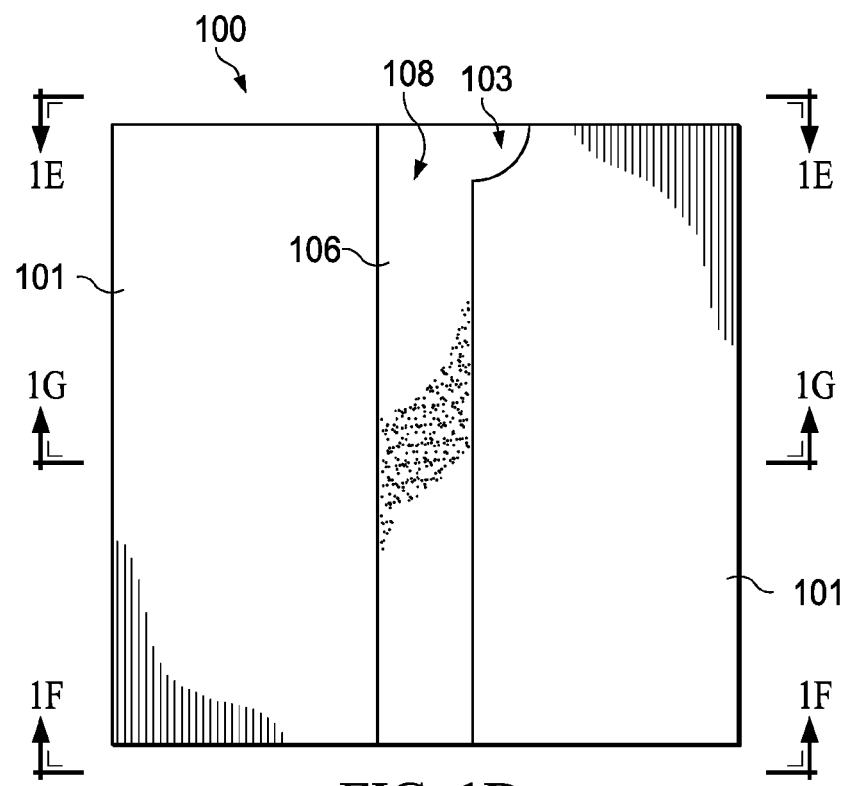
Figure 1E:
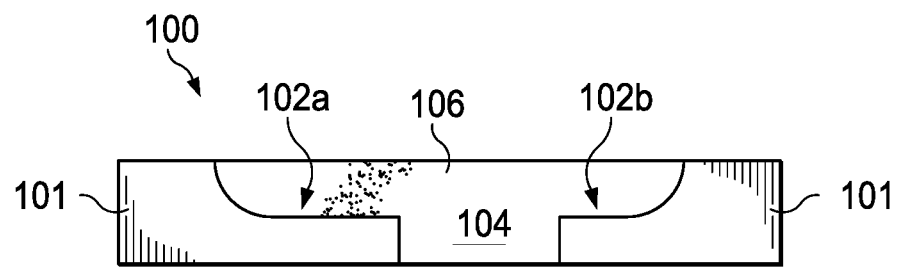
Figure 1F:
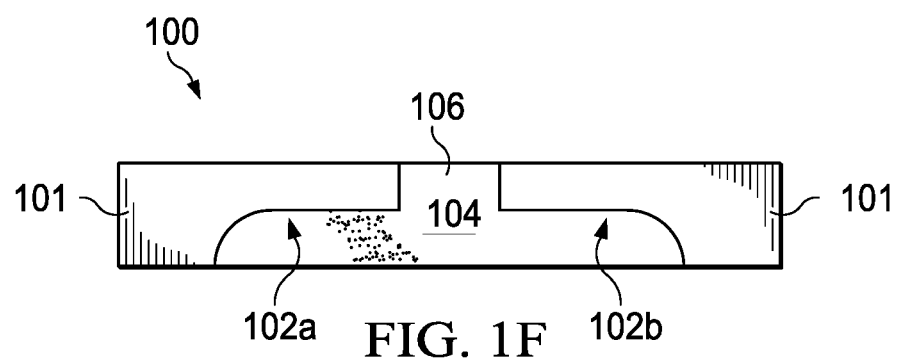
Figure 1G:
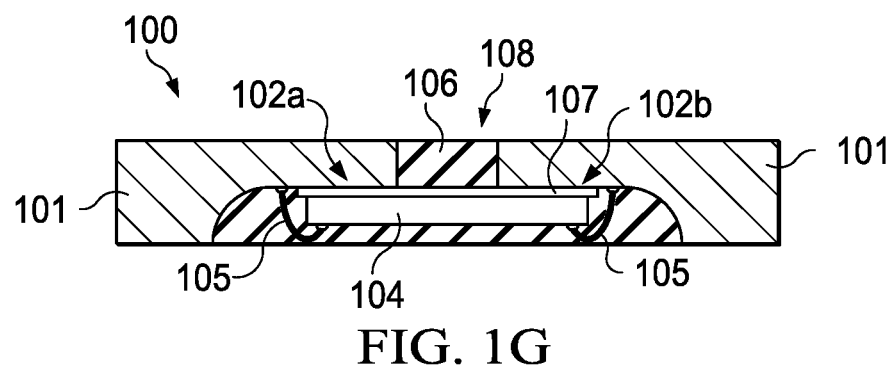

FIG. 1B is a top view of the example package 100 after molding 106 is applied. FIG. 1C is a side view of the example package 100 where mechanical metal contacts can be attached, as described with reference to FIGS. 3A-3D. FIG. 1D is a bottom view of package 100 after molding 106 is applied. Space 108 is shown filled with molding 106. FIGS. 1E and 1F are end views of package 100 (FIG. 1F is bottom side up) after molding 106 is applied. Note that FIG. 1E is the end with orientation indicator 103. FIG. 1G is a cross-sectional view that shows silicon die 104 attached to etched portions 102a, 102b of leadframe 101 with die attachment material 107. Silicon die 104 is overlying across space 108, which is filled with molding material 106. Wirebonds 105 electrically couple silicon die 104 to etched portions 102a, 102b of leadframe 101, wherein etched portions 102a, 102b define electrical contact pads for package 100.

Figure 2A:
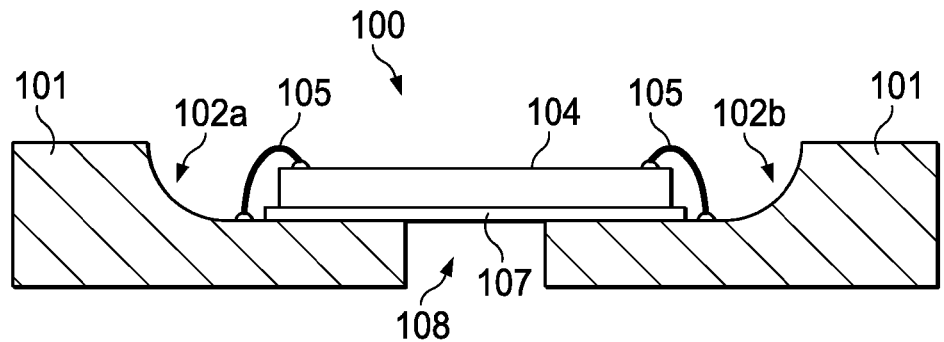
FIGS. 2A and 2B are end views of alternative configurations for the example electronic package of FIG. 1, according to an embodiment.
Figure 2B:
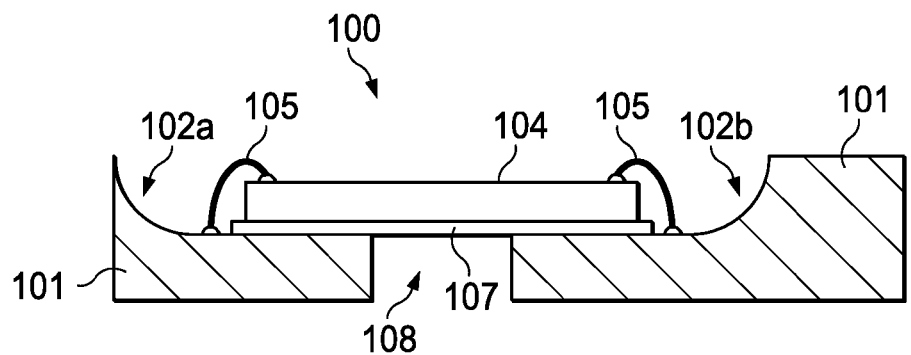

FIGS. 2A and 2B illustrate an end view of alternative configurations for the example electronic package of FIG. 1, according to an embodiment. The configuration shown in FIG. 2B differs from the configuration shown in FIG. 2A in that a portion of leadframe 101 is eliminated from the design to reduce the package size. The configuration shown in FIG. 2A can be used for a two top side contact application and the configuration shown in FIG. 2B can be used for a one top side contact application.

Figure 3A:
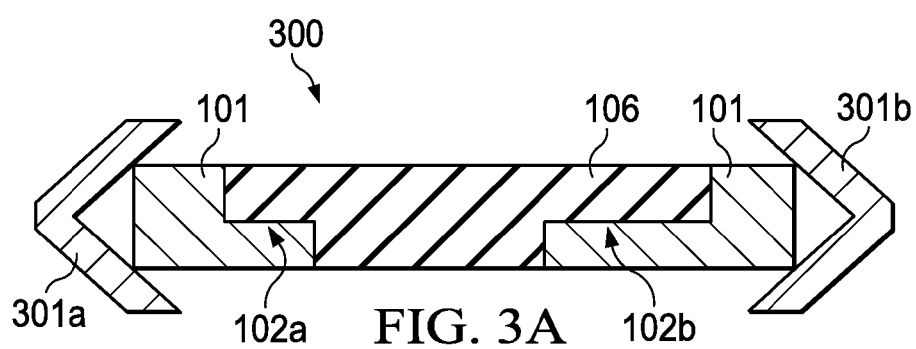
Figure 3D:
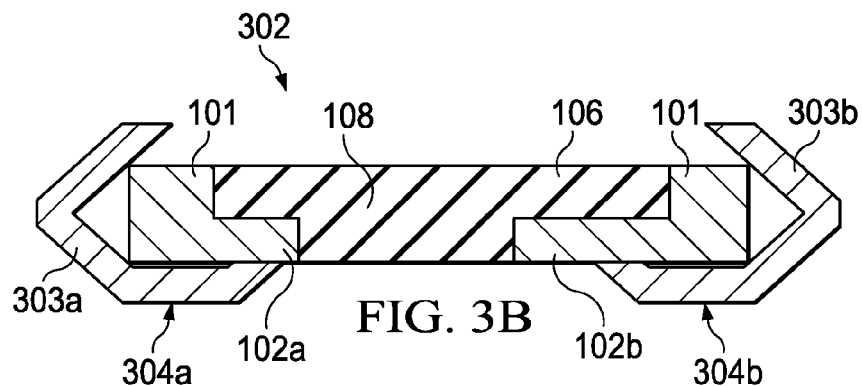
Figure 3D:
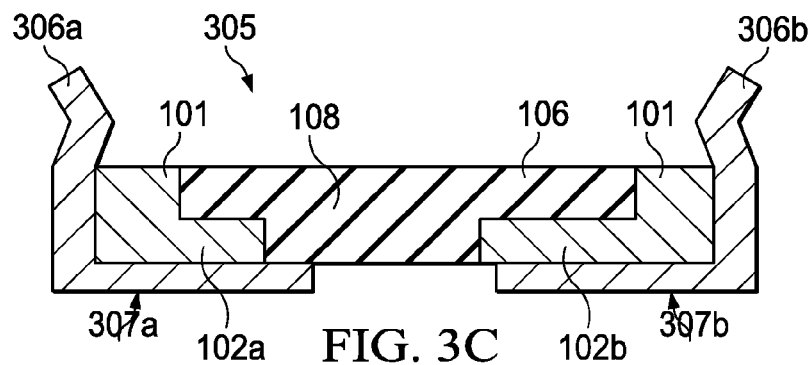
Figure 3D:
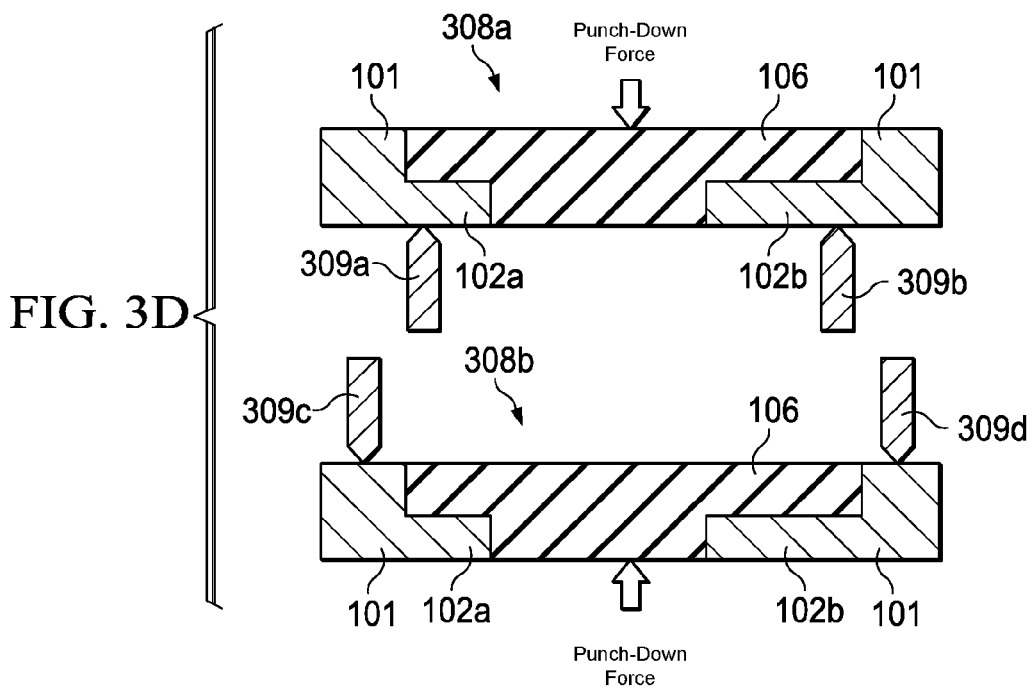

FIGS. 3A-3D illustrate example methods of attaching mechanical metal contacts to opposing sides of an electronic package, according to an embodiment. In the example embodiment of FIG. 3A, package 300 includes "V" shape metal contacts 301a, 301b attached to opposing sides of leadframe 101. In the example embodiment of FIG. 3B, package 302 includes "U" shape metal contacts 303a, 303b attached to opposing sides of leadframe 101. Contacts 303a, 303b have extended portions 304a, 304b that electrically couple with etched portions 102a, 102b on the bottom of package 302. In the example embodiment of FIG. 3C, package 305 includes "L" shape metal contacts 306a, 306b attached to opposing sides of leadframe 101. Contacts 306a, 306b have extended portions 307a, 307b that electrically coupled to etched portions 102a, 102b on the bottom side of package 305 and partially extend over space 108, which is filled with molding 106. FIG. 3D illustrates two different contacting schemes. In a first contacting scheme, contacts 309a, 309b make contact to the bottom side of package 308a at etched portions 102a, 102b of leadframe 101. In a second contacting scheme, contacts 309c, 309d make contact to the top side of package 308b at etched portions 102a, 102b of leadframe 101. Note that the "arrow" indicates the direction of a "punch-down" force.

Figure 4A:
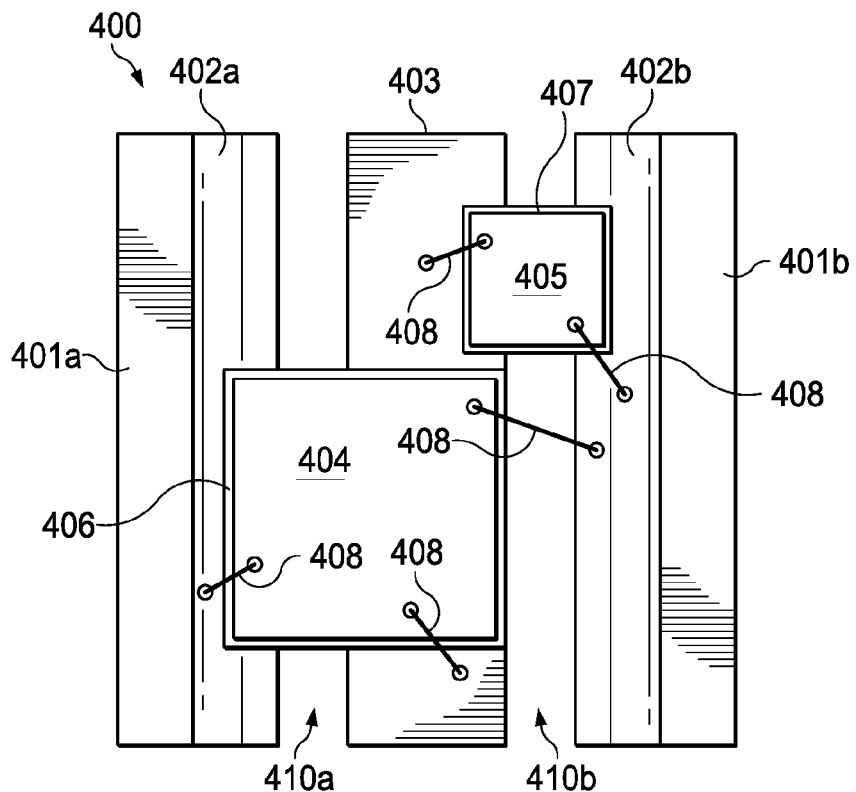
FIGS. 4A-4F are various views of an example electronic package with multiple silicon dice, according to an embodiment.

FIGS. 4A-4F are various views of an example electronic package with multiple silicon dice, according to an embodiment. Referring to FIG. 4A, package 400 includes leadframe 401 with etched portions 402a, 402b (e.g., half-etched portions). A middle portion 403 of leadframe 401 is etched to the same height as etched portions 402a, 402b. Silicon die 404 overlies cavity 410a and is attached at etched portions 402a and 403. Silicon die 405 overlies cavity 410b and is attached at etched portions 402b and 403. Silicon dice 404, 405 are attached to etched portions 402, 403 by die attachment material 406, 407, respectively. Silicon dies 404, 405 are electrically coupled to etched portions 402, 403 by wirebonds 408.

Figure 4B:
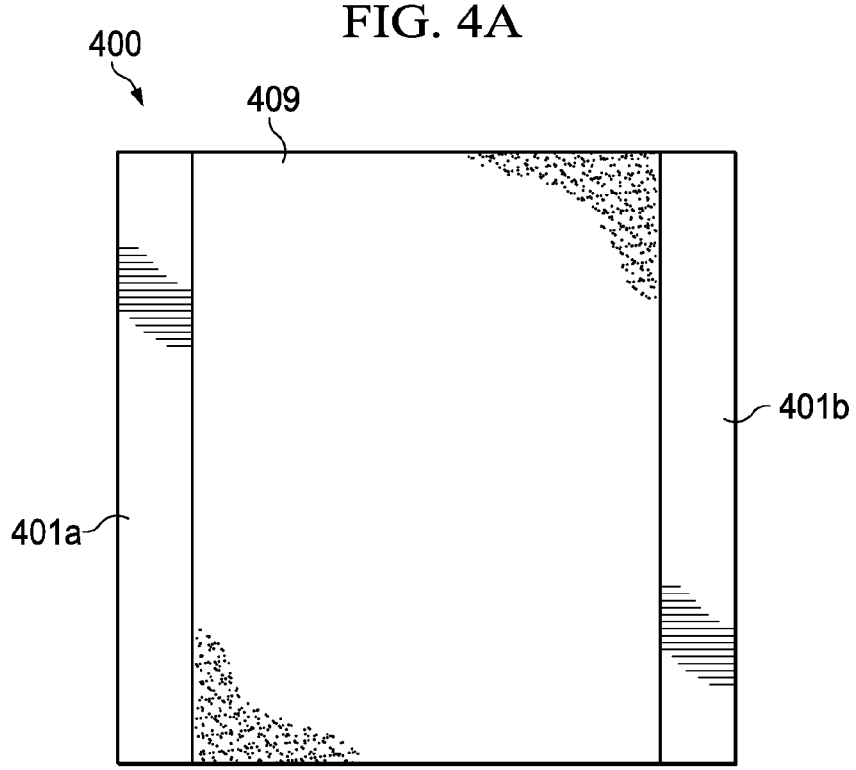
Figure 4C:
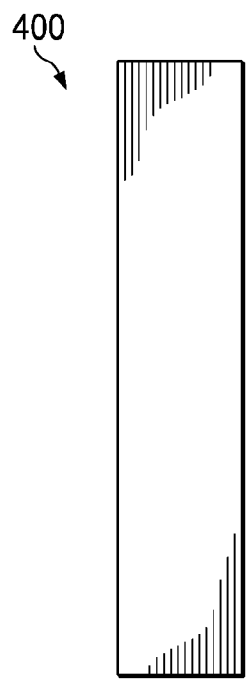
Figure 4D:
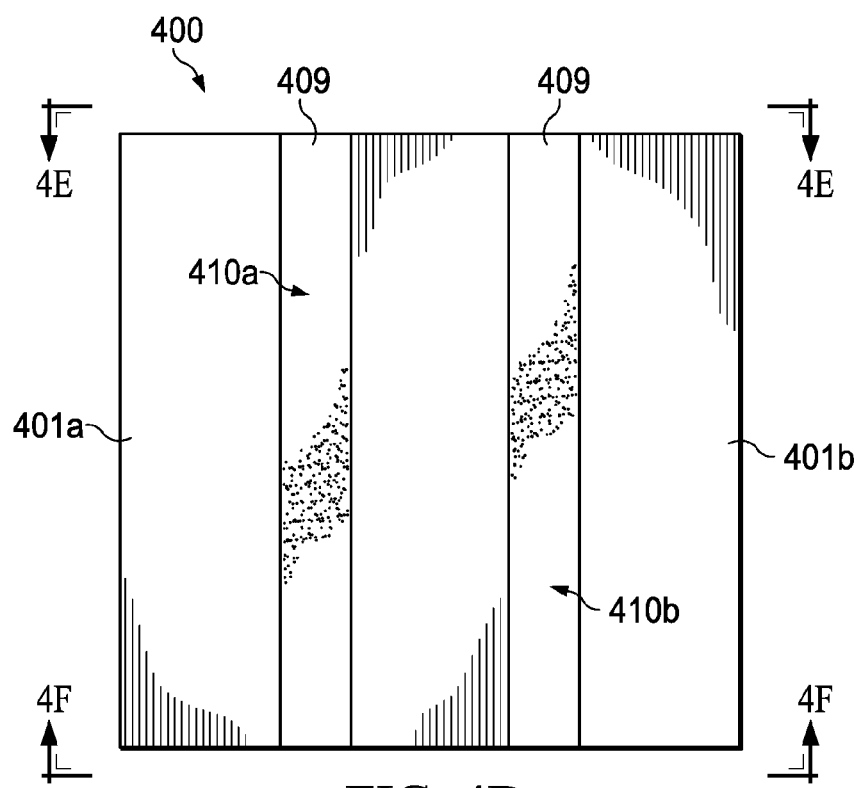
Figure 4E:
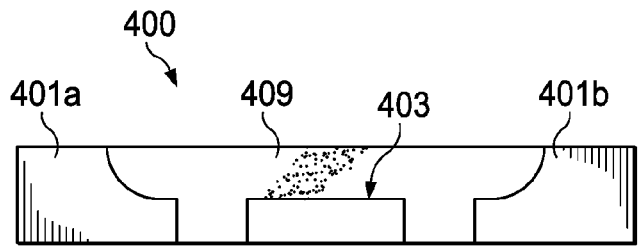
Figure 4F:
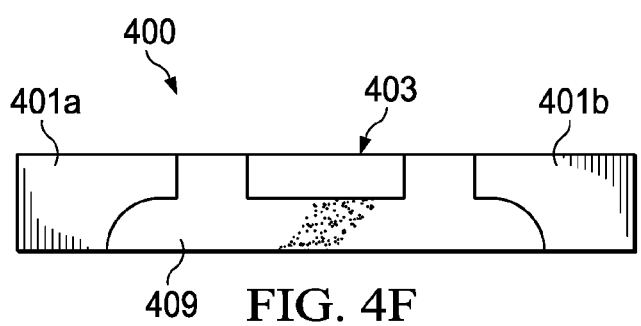

FIG. 4B is a top view of package 400 after molding 409 is applied. FIG. 4C is a side view of package 400 where metal contacts can be attached to sides (e.g., opposing sides) of package 400, as described with reference to FIGS. 3A-3D. FIG. 4D is a bottom view of package 400 after molding. Cavities 410a, 410b are shown filled with molding 409. FIGS. 4E and 4F are end views of package 400 after molding.

Figure 5A:
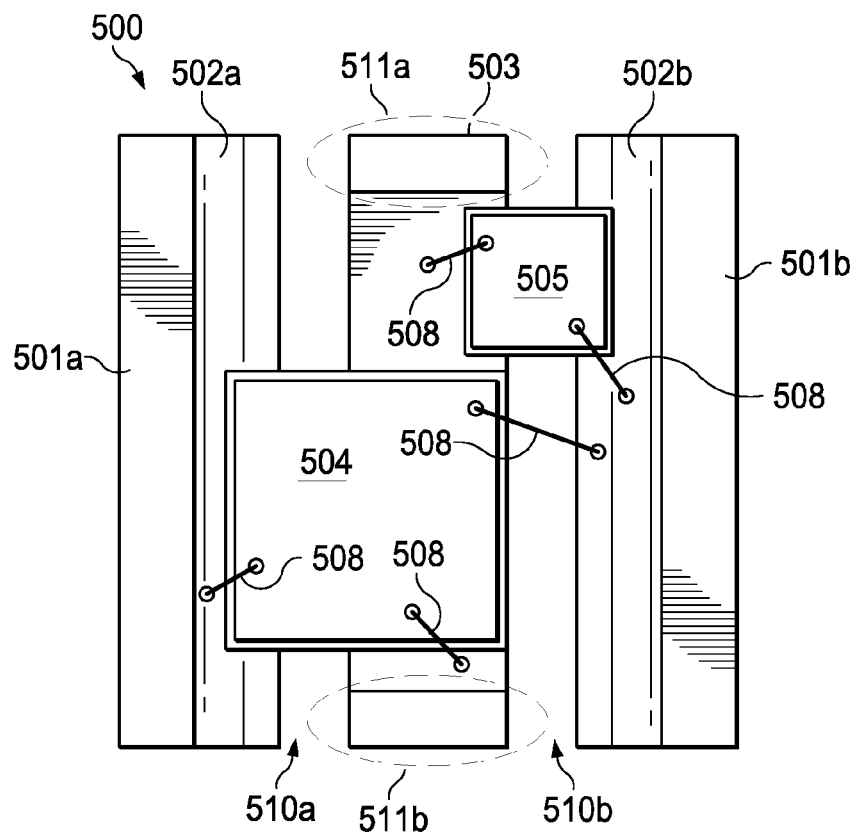
FIGS. 5A-5F are various views of another example electronic package with multiple silicon dice, according to an embodiment.

FIGS. 5A-5F are various views of another example electronic package with multiple silicon dice, according to an embodiment. Referring to FIG. 5A, package 500 includes leadframe 501 with etched portions 502a, 502b (e.g., "half-etched" portions). A middle portion 503 of leadframe 501 is etched to the same height as etched portions 502a, 502b. Silicon die 504 overlies space 510a and is attached at etched portions 502a and 503. Silicon die 505 overlies space 510b and is attached at etched portions 502b and 503. Silicon dice 504, 505 are attached to etched portions 502, 503 by die attachment material 506, 507, respectively. Silicon dies 504, 505 are electrically coupled to etched portions 502, 503 by wirebonds 508. Note that package differs from package 400 in that the middle portion 503 has "non-etched" portions 511a, 511b.

Figure 5B:
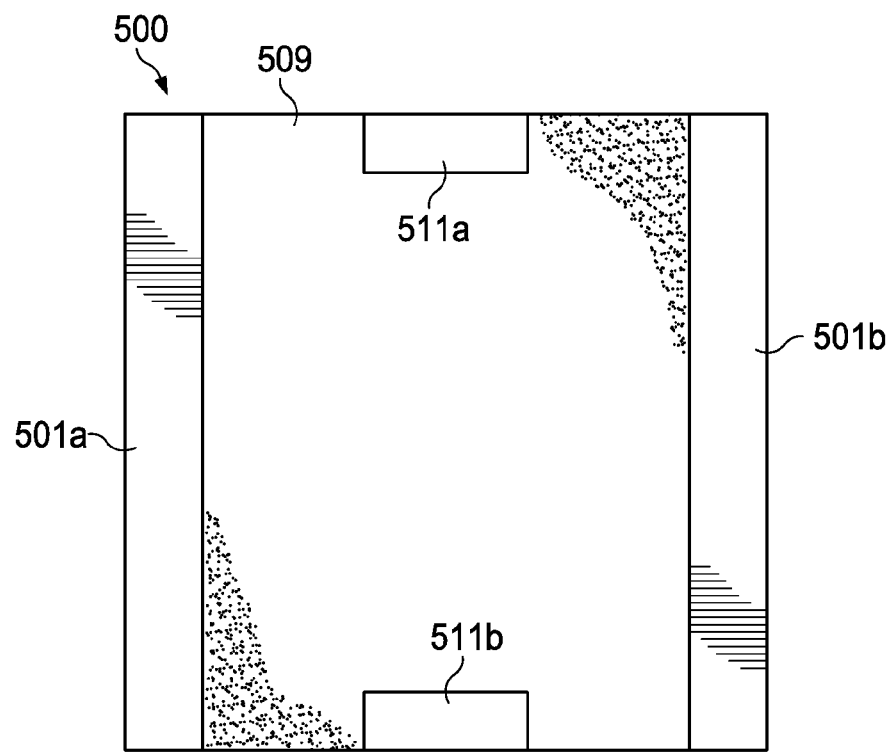
Figure 5C:
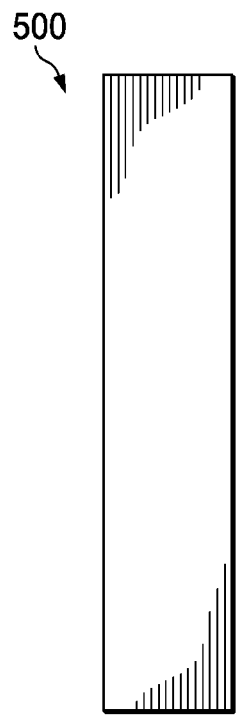
Figure 5D:
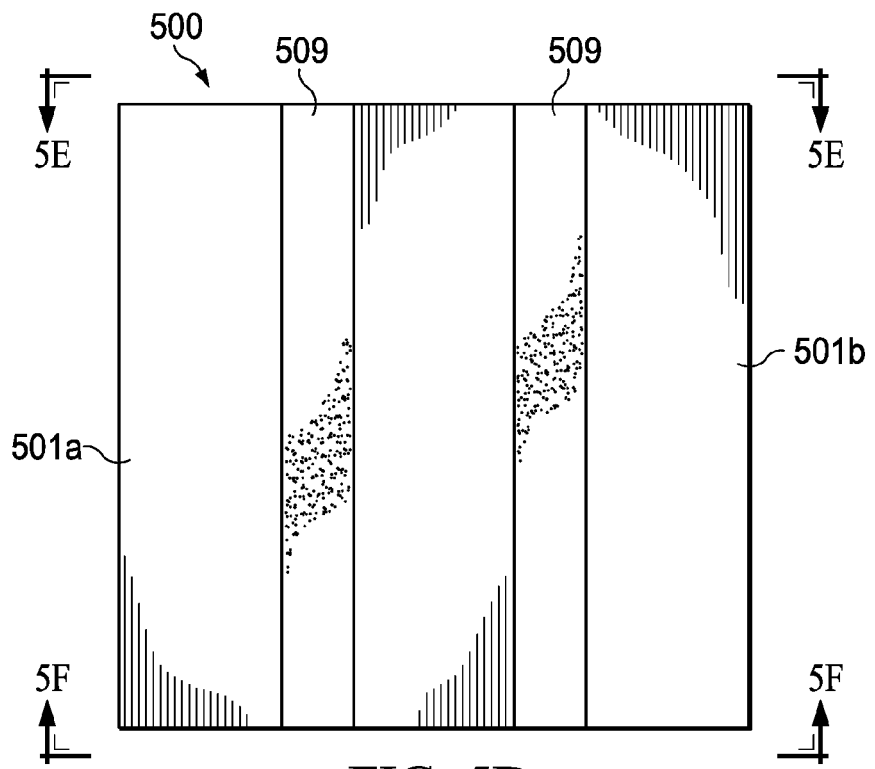
Figure 5E:
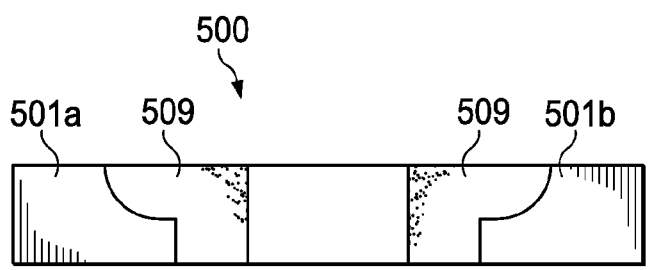
Figure 5F:
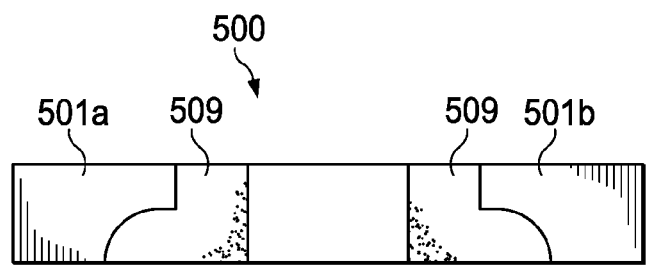

FIG. 5B is a top view of package 500 after molding 509 is applied. FIG. 5C is a side view of package 500 where metal contacts can be attached to sides (e.g., opposing sides) of package 500, as described with reference to FIGS. 3A-3D. FIG. 5D is a bottom view of package 500 after molding 509 is applied. Spaces 510a, 510b are shown filled with molding 509. FIGS. 5E and 5F are end views of package 500 after molding.

Figure 6A:
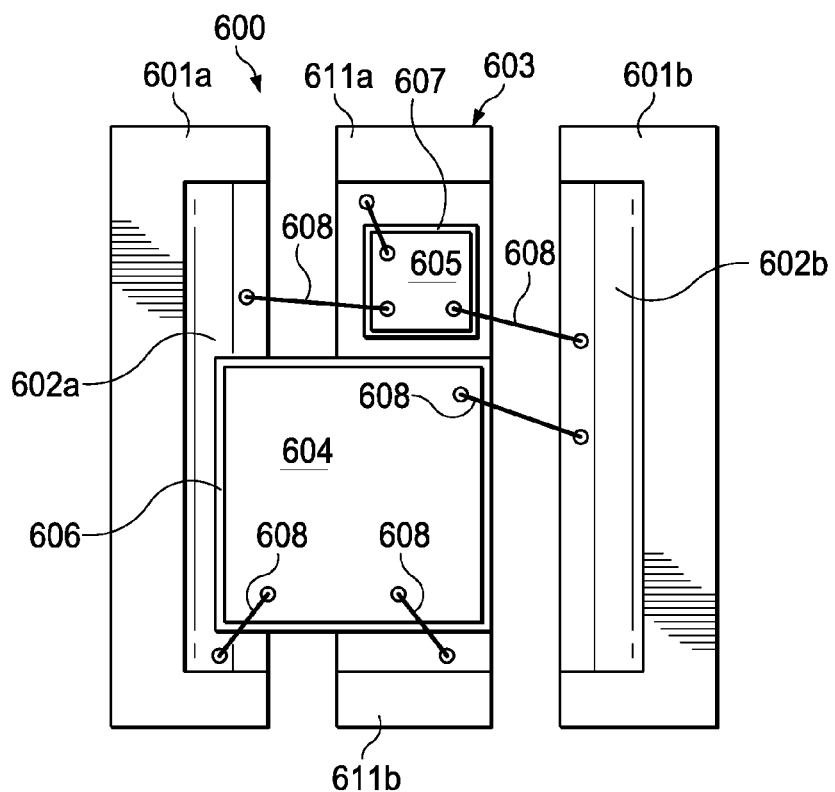
FIGS. 6A-6F are various views of another example electronic package with multiple silicon dice, according to an embodiment.

FIGS. 6A-6F are various views of another example electronic package with multiple silicon dies, according to an embodiment. Referring to FIG. 6A, package 600 is a "top-side contact" variation of package 500 and includes leadframe 601 with etched portions 602a, 602b (e.g., "half-etched" portions). A middle portion 603 of leadframe 601 is etched to the same height as etched portions 602a, 602b. Silicon die 604 overlies cavity 610a and is attached at etched portions 602a and 603. Silicon die 605 overlies cavity 610b and is attached at etched portions 602b and 603. Silicon dies 604, 605 are attached to etched portions 602, 603 by die attachment material 606, 607, respectively. Silicon dies 604, 605 are electrically coupled to etched portions 602, 603 by wirebonds 608. Middle portion 603 has non-etched portions 611a, 611b. A difference between package 500 and package 600 is that leadframe portions 601a, 601b have a different shape then leadframe portions 501a, 501b to add contact flexibility.

Figure 6B:
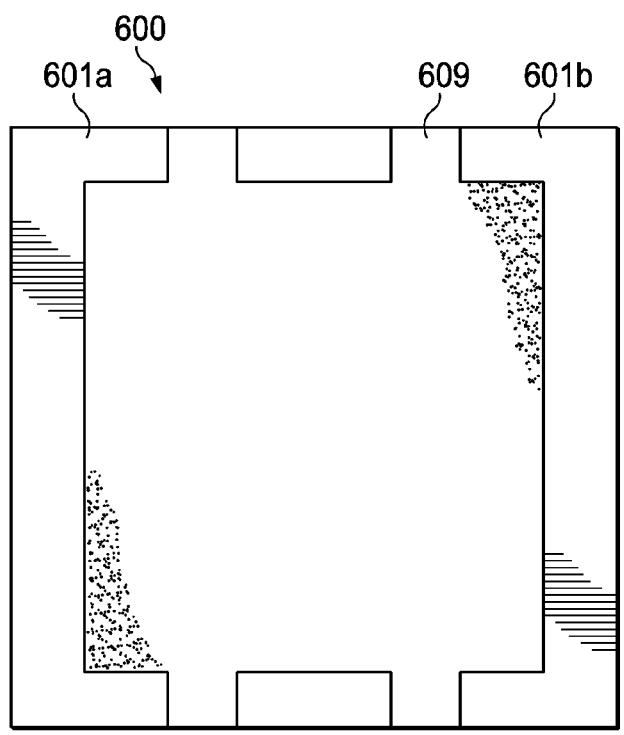
Figure 6C:
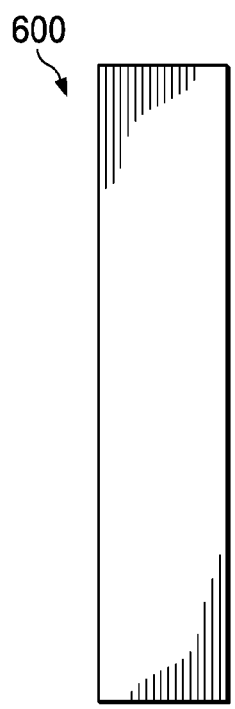
Figure 6D:
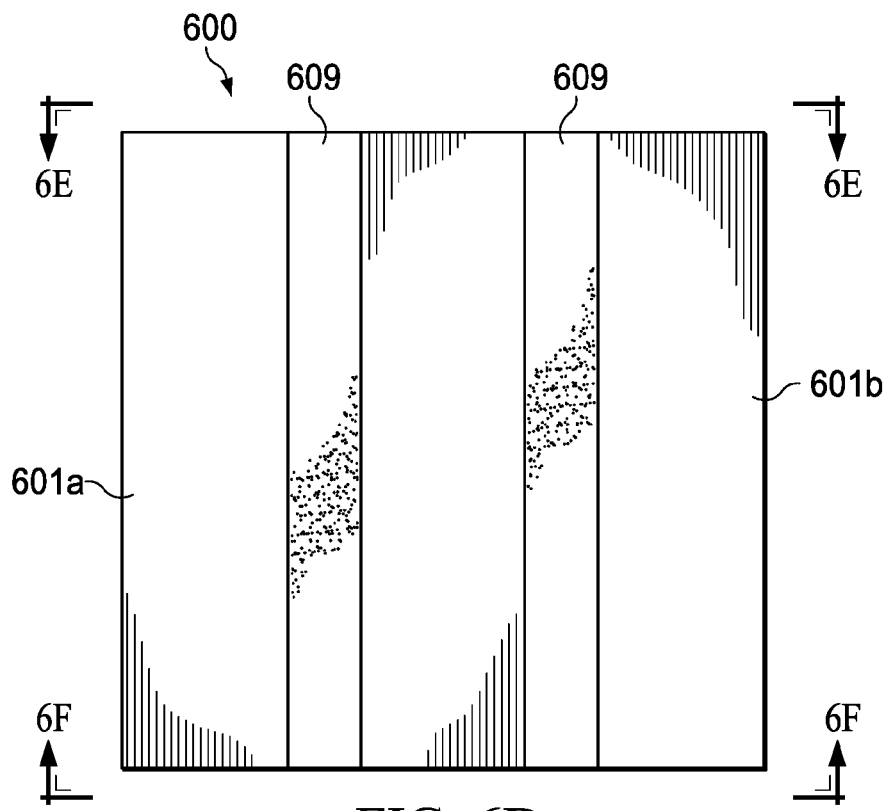
Figure 6E:
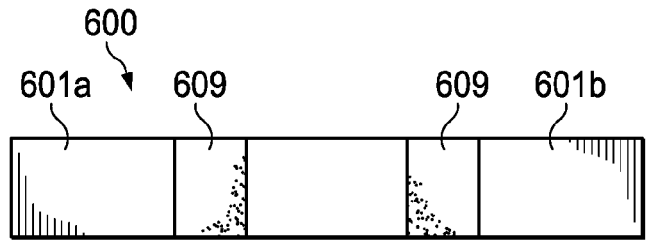
Figure 6F:
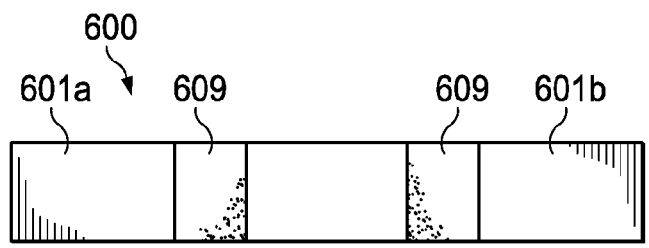

FIG. 6B is a top view of package 600 after molding 609 is applied. FIG. 6C is a side view of package 600 where metal contacts can be attached to sides (e.g., opposing sides) of package 600, as described with reference to FIGS. 3A-3D. FIG. 6D is a bottom view of package 600 after molding 609 is applied. Spaces 610a, 610b are shown filled with molding 609. FIGS. 6E and 6F are end views of package 600 after molding.

Example Process

Figure 7:
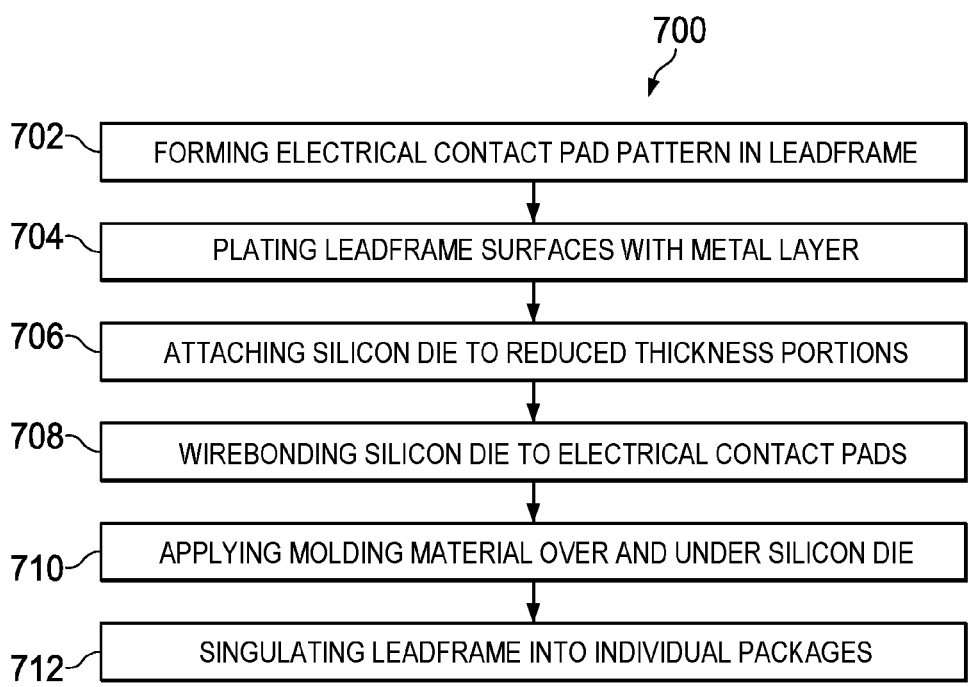
FIG. 7 is a flow diagram of an example process of fabricating an electronic package, according to an embodiment.

FIG. 7 is a flow diagram of an example process 700 of fabricating an electronic package (e.g., a TSB package), according to an embodiment. In an embodiment, process 700 begins by etching (e.g., "half-etching") or metal coining and stamping an electronic package leadframe with a contact pad pattern (702) and plating the leadframe surfaces with a metal layer (704). The leadframe should be thick (e.g., in a range of 0.3 mm to 1.5 mm) and the plating can be, for example, Ni—Pd—Au. Other plating metallurgy variations can also work (e.g., Ni—Au, Ni—Ag, Ag, etc.). Full plating, spot plating and even no plating can work depending on the application.

Process 700 continues by attaching a silicon die to the etched portion (706). For example, the silicon die can be attached to the etched portion with a non-conductive epoxy paste or film depending on the application. In an embodiment, flip-chip soldering can also be used to attach the silicon die to the etched portion of the leadframe.

Process 700 continues by applying mold material over and under the silicon die (708), such that the non-etched (e.g., full thickness) portion of the electronic package leadframe is exposed. The process can be, for example, a film-assist molding process or an equivalent process. In an alternative embodiment, post-mold grinding can be used to expose the metal leadframe.

Process 700 can continue by wirebonding the silicon die to the electronic package leadframe (710).

Process 700 continues by singulating the molded lead frame into individual packages (712). For example, the singulating can accomplished by mechanical sawing or laser cutting.

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. An electronic package comprising:
    a metal leadframe having a first leadframe portion having a first thickness and a second leadframe portion having a second thickness that is less than the first thickness, the second leadframe portion forming electrical contact pads;
    a silicon die attached to the second leadframe portion and overlying a space formed in the leadframe by the first and second leadframe portions, wherein the silicon die is attached to the second leadframe portion with non-conductive die attachment material; and
    wirebonds coupling the silicon die to the second leadframe portion.

2. The electronic package of claim 1, further comprising:
    metal contacts attached to sides of the leadframe and coupled to the second leadframe portion.

3. The electronic package of claim 1, further comprising:
    mold material overlying the silicon die and filling the space.

4. The electronic package of claim 1, wherein the second thickness is at least half the first thickness and the first thickness is in a range of about 0.3 mm to about 1.4 mm.

5. The electronic package of claim 4, wherein the second leadframe portion is configured for attaching the die and wirebonding.

6. A method of fabricating an electronic package, comprising:
    forming in a metal leadframe a first leadframe portion having a first thickness and a second leadframe portion having a second thickness less than the first thickness;
    attaching, using non-conductive die attachment material, a silicon die to the second leadframe portion such that the silicon die overlies a space formed in the leadframe by the first and second leadframe portions; and
    electrically coupling the silicon die to the second leadframe portion.

7. The method of claim 6, further comprising:
    wirebonding the silicon die to the second leadframe portion.

8. The method of claim 6, further comprising:
    applying mold material over the leadframe, the mold material filling the space under the silicon die.

9. The method of claim 6, further comprising:
    singulating the leadframe into individual electronic packages; and
    attaching metal contacts to opposing sides of the individual electronic packages.

10. The method of claim 6, wherein the second thickness is at least half the first thickness and the first thickness is in a range of about 0.3 mm to about 1.5 mm.

11. The method of claim 10, wherein forming in a metal leadframe a first leadframe portion having a first thickness and a second leadframe portion having a second thickness less than the first thickness further comprises:
    etching the second leadframe portion in the metal leadframe.

12. The method of claim 10, wherein forming in a metal leadframe a first leadframe portion having a first thickness and a second leadframe portion having a second thickness less than the first thickness further comprises:
    metal stamping the second leadframe portion in the metal leadframe.

13. The method of claim 10, wherein forming in a metal leadframe a first leadframe portion having a first thickness and a second leadframe portion having a second thickness less than the first thickness further comprises:
    coining the second leadframe portion in the metal leadframe.

* * * * *